US012604564B2

(12) United States Patent
Qiu

(10) Patent No.: US 12,604,564 B2
(45) Date of Patent: Apr. 14, 2026

(54) SUBSTRATE AND LIGHT-EMITTING SUBSTRATE

(71) Applicant: TCL China Star Optoelectronics Technology Co., Ltd., Shenzhen (CN)

(72) Inventor: Zhilong Qiu, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 552 days.

(21) Appl. No.: 18/079,060

(22) Filed: Dec. 12, 2022

(65) Prior Publication Data

US 2024/0120442 A1     Apr. 11, 2024

(30) Foreign Application Priority Data

Oct. 10, 2022     (CN) .......................... 202211234221.6

(51) Int. Cl.
H10H 20/814 (2025.01)
G09G 3/32 (2016.01)
H10H 20/857 (2025.01)

(52) U.S. Cl.
CPC ............. H10H 20/814 (2025.01); G09G 3/32 (2013.01); H10H 20/857 (2025.01)

(58) Field of Classification Search
None
See application file for complete search history.

(56) References Cited

U.S. PATENT DOCUMENTS

| | | | | |
|---|---|---|---|---|
| 2017/0084634 | A1* | 3/2017 | Oh | H10D 86/451 |
| 2017/0125500 | A1* | 5/2017 | Kim | H10D 86/60 |
| 2020/0035147 | A1* | 1/2020 | Ban | H10H 20/83 |
| 2020/0091203 | A1* | 3/2020 | Xue | H10D 86/441 |
| 2020/0127077 | A1* | 4/2020 | Son | H10D 86/471 |
| 2022/0043527 | A1* | 2/2022 | Shim | H10K 59/40 |

FOREIGN PATENT DOCUMENTS

| | | |
|---|---|---|
| CN | 112396979 A | 2/2021 |
| CN | 113840450 A | 12/2021 |

OTHER PUBLICATIONS

Chinese Office Action issued in corresponding Chinese Patent Application No. 202211234221.6 dated Aug. 22, 2025, pp. 1-10.

* cited by examiner

*Primary Examiner* — Khaja Ahmad

(74) *Attorney, Agent, or Firm* — PV IP PC; Wei Te Chung

(57) ABSTRACT

A substrate and a light-emitting substrate are provided. The substrate includes a driving function layer, an insulating layer, and a reflective layer which are sequentially arranged on a base. The driving function layer includes a conductive pad. An opening exposing the conductive pad is defined on the insulating layer. In a direction perpendicular to the substrate, a height of a part of the insulating layer located surrounding the opening is greater than a height of the reflective layer.

20 Claims, 3 Drawing Sheets

SUBSTRATE AND LIGHT-EMITTING SUBSTRATE

TECHNICAL FIELD

The present application relates to a field of display technologies, and specifically relates to a substrate and a light-emitting substrate.

BACKGROUND

A white oil layer is generally formed on a substrate during a manufacturing process of a mini light-emitting diode (Mini-LED) substrate or a micro light-emitting diode (Micro-LED) substrate. The white oil layer is generally manufactured by a screen-printing process or a jet printing process. The screen-printing process has a higher precision, however, an equipment for the screen-printing process is in direct contact with the substrate, so that the substrate is scratched easily, and a metal layer of the substrate is short-circuited. Adopting the jet printing process may prevent a direct contact between an equipment for the jet printing process and the substrate, which can effectively prevent the substrate from being scratched. However, a printing precision of the jet printing process is hard to guarantee, white oil is easy to overflow to a pad area bound to LEDs, and pads are oxidized and discolored, thus resulting in abnormal tin loading, and the LEDs are unable to be typed normally.

Therefore, it is necessary to provide technical solutions to solve above problems.

SUMMARY

A substrate and a light-emitting substrate are provided by the present application to solve a problem that white oil is easy to overflow to a pad area when a white oil reflective layer of an LED substrate in prior art is manufactured by a jet printing process.

To solve the above mentioned problem, technical solutions provided by the present application are as follows.

A substrate is provided by an embodiment of the present application, including: a base; a driving function layer located at a side of the base, the driving function layer comprises a conductive pad; an insulating layer disposed on a side of the driving function layer away from the base, an opening exposing the conductive pad is defined on the insulating layer; a reflective layer disposed on a side of the insulating layer away from the base; and in a direction perpendicular to the substrate, a height of a part of the insulating layer located surrounding the opening is greater than a height of the reflective layer, and the part of the insulating layer located surrounding the opening protrudes from a surface of the reflective layer.

In an embodiment of the present application, the substrate further includes a barrier part located on the base and disposed facing the driving function layer, the barrier part corresponds to the opening, the driving function layer includes a first sub-barrier part corresponding to the barrier part, the insulating layer includes a second sub-barrier part corresponding to the first sub-barrier part, and the reflective layer is located on a side of the second sub-barrier part away from the opening.

In an embodiment of the present application, the barrier part includes a boss, an orthographic projection of the first sub-barrier part on the base covers an orthographic projection of the boss on the base, and an orthographic projection of the opening on the base is within an area of the orthographic projection of the boss on the base. A part of the driving function layer corresponding to the boss is protruded in a direction facing away from the base to form the first sub-barrier part, a part of the insulating layer corresponding to the first sub-barrier part is protruded in the direction facing away from the base to form the second sub-barrier part, and an orthographic projection of the second sub-barrier part on the base partially overlaps the orthographic projection of the first sub-barrier part on the base.

In an embodiment of the present application, a thickness of the boss ranges from 1 μm to 20 μm, and a thickness of the first sub-barrier part is greater than or equal to the thickness of the boss.

In an embodiment of the present application, the barrier part further includes a groove defined at an outer periphery of the boss, the driving function layer further includes a third sub-barrier part located at an outer periphery of the first sub-barrier part, the insulating layer further includes a fourth sub-barrier part corresponding to the third sub-barrier part, the fourth sub-barrier part is located at an outer periphery of the second sub-barrier part, and an edge part of the reflective layer adjacent to the opening is located on the fourth sub-barrier part. A part of the driving function layer corresponding to the groove is recessed toward a side adjacent to the base to form the third sub-barrier part, a part of the insulating layer corresponding to the third sub-barrier part is recessed toward a side adjacent to the base to form the fourth sub-barrier part, and an orthographic projection of the fourth sub-barrier part on the base at least partially overlaps an orthographic projection of the third sub-barrier part on the base; the third sub-barrier part abuts the first sub-barrier part, and the fourth sub-barrier part abuts the second sub-barrier part.

In an embodiment of the present application, the driving function layer further includes a thin film transistor, and an orthographic projection of the thin film transistor on the base overlaps the orthographic projection of the boss on the base; the conductive pad is located on a side of the thin film transistor away from the base, and the conductive pad is electrically connected with the thin film transistor through a via hole.

In an embodiment of the present application, the driving function layer further includes a thin film transistor, the thin film transistor includes a source electrode and a drain electrode, and an orthographic projection of the thin film transistor on the base and the orthographic projection of the boss on the base are spaced; and the conductive pad, the source electrode, and the drain electrode are disposed in a same layer, and the conductive pad is electrically connected with the source electrode or the drain electrode.

In an embodiment of the present application, there is a height difference between a part of the insulating layer adjacent to the second sub-barrier part and the second sub-barrier part, and the height difference is greater than or equal to a thickness of the reflective layer.

In an embodiment of the present application, the second sub-barrier part extends along a side surface of the first sub-barrier part to a side of the first sub-barrier part facing away from the base.

A light-emitting substrate is provided by an embodiment of the present application. The light-emitting substrate includes the substrate mentioned above and a light-emitting diode (LED) chip, and the LED chip is disposed on the substrate.

The substrate and the light-emitting substrate are provided by the present application. The substrate includes the driving function layer, the insulating layer, and the reflective layer stacked. The driving function layer includes the conductive pad. The opening exposing the conductive pad is defined on the insulating layer. The height of the part of the insulating layer located surrounding the opening is greater than the height of the reflective layer, and the part of the insulating layer located surrounding the opening protrudes from the surface of the reflective layer. The insulating layer protruded may prevent the reflective layer from overflowing toward a side adjacent to the opening after the reflective layer is manufactured, so as to solve the problem that the white oil is easy to overflow, which results in abnormal tin loading when the white oil reflective layer is manufactured by the jet printing process.

DESCRIPTION OF DRAWINGS

To describe technical solutions of embodiments of the present application more clearly, the following briefly introduces accompanying drawings used in a description of the embodiments of the present disclosure. Apparently, the accompanying drawings described below illustrate only some exemplary embodiments of the present application, and persons skilled in the art may derive other drawings from the drawings without making creative efforts.

DETAILED DESCRIPTION OF EMBODIMENTS

Figure 1:
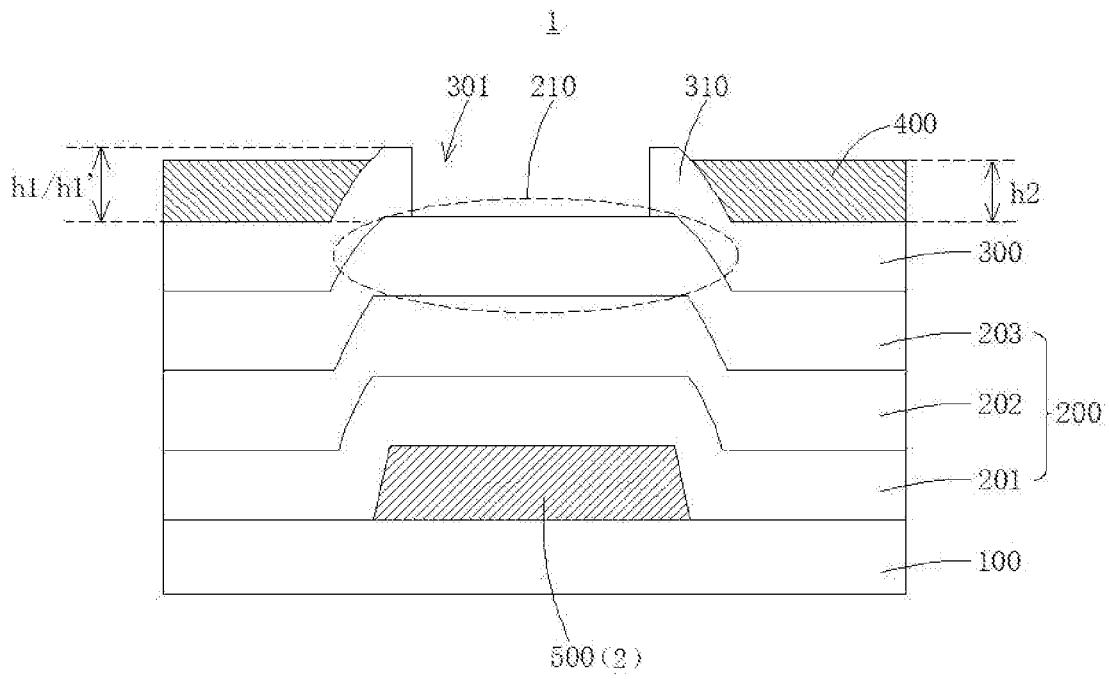
FIG. 1 is a schematic cross-sectional diagram of a substrate in a first embodiment of the present application.

The technical solutions in embodiments of the present application will be described clearly and completely hereafter with reference to the accompanying drawings. Apparently, described embodiments are only a part of but not all embodiments of the present application. All other embodiments obtained by persons of ordinary skill in the art based on the embodiments of the present disclosure without creative efforts shall fall within a protection scope of the present application. In addition, it should be understood that specific embodiments described herein are merely for explaining the present application, the term "embodiment" used in a context means an example, instance, or illustration, and the present application is not limited thereto. In the present application, location terms such as "up" and "down" are used in general to refer to up and down in actual use or operation of a device, in particular drawing directions in the drawings, without description to the contrary. While "inside" and "outside" are for the outline of the device.

Referring to FIG. 1 to FIG. 5, a substrate 1 is provided by embodiments of the present application. The substrate 1 may applied to a mini light-emitting diode (Mini-LED) display panel, a micro light-emitting diode (Micro-LED) display panel, or other display panels. The substrate 1 includes a base 100, a driving function layer 200, an insulating layer 300, and a reflective layer 400. The driving function layer 200 is located on the base 100. The insulating layer 300 is located on the driving function layer 200. The reflective layer 400 is located on the insulating layer 300.

The driving function layer 200 includes a conductive pad 203. An opening 301 exposing the conductive pad 203 is defined on the insulating layer 300. In a direction perpendicular to the substrate 1, a height of a part of the insulating layer 300 located surrounding the opening 301 is greater than a height of the reflective layer 400. The part of the insulating layer 300 located surrounding the opening 301 protrudes from a surface of the reflective layer 400. After the reflective layer 400 is manufactured completely, the part of the insulating layer 300 located surrounding the opening 301 will protrude from or be higher than the surface of the reflective layer 400, which may block the reflective layer 400 overflowing to a side of the opening 301, thereby solving a problem that white oil is easy to overflow, which results in abnormal tin loading when a white oil reflective layer is manufactured by a jet printing process.

Furthermore, in some embodiments, the substrate 1 further includes a barrier part 2 located on the base 100 and disposed facing the driving function layer 200, and the barrier part 2 is disposed corresponding to the opening 301.

The driving function layer 200 includes a first sub-barrier part 210 corresponding to the barrier part 2. The insulating layer 300 includes a second sub-barrier part 310 corresponding to the first sub-barrier part 210. The reflective layer 400 is located on a side of the second sub-barrier part 310 away from the opening 301.

Specifically, the second sub-barrier part 310 is a part of the insulating layer 300 located on the first sub-barrier part 210. The second sub-barrier part 310 is annular shaped. An orthographic projection of the second sub-barrier part 310 on the base 100 overlaps an orthographic projection of the first sub-barrier part 210 on the base 100. Furthermore, the orthographic projection of the first sub-barrier part 210 on the base 100 is within an area of the orthographic projection of the second sub-barrier part 310 on the base 100.

The barrier part 2 is disposed on a side of the base 100 facing the driving function layer 200 in the embodiments of the present application. The barrier part 2 enables the driving function layer 200 above to form the first sub-barrier part 210 protruding in a direction facing away from the substrate 100. The conductive pad 203 is disposed on the first sub-barrier part 210. Affected by the first sub-barrier part 210, the insulating layer 300 above the driving function layer 200 forms the second sub-barrier part 310 protruding in a direction facing away from the substrate 100 at a position corresponding to the first sub-barrier part 210, and the insulating layer 300 exposes the conductive pad 203. When the reflective layer 400 is manufactured by the jet printing process, the reflective layer 400 is blocked by the second sub-barrier part 310, thereby preventing the reflective layer 400 from overflowing onto the conductive pad 203 and leading to abnormal tin loading.

The substrate provided by the present application is described in detail with reference to following embodiments, which are described in detail as follows.

Referring to FIG. 1, a schematic cross-sectional diagram of a substrate in a first embodiment of the present application is shown. The substrate 1 includes the base 100, the driving function layer 200, the insulating layer 300, and the reflective layer 400 stacked.

The base 100 may be a glass base or a flexible base. The driving function layer 200 includes a first metal layer 201, a gate insulating layer 202, and the conductive pad 203. The gate insulating layer 202 is located between the first metal layer 201 and the conductive pad 203. It should be noted that the driving function layer 200 further includes other conventional film layers, such as an active layer.

The substrate 1 further includes the barrier part 2 located on the base 100. In the embodiment, the barrier part 2 includes a boss 500. The boss 500 is located on a side surface of the base 100 facing the driving function layer 200.

A thickness of the boss 500 ranges from 1 μm to 20 μm. For example, the thickness of the boss 500 may be 5 μm, 10 μm, 15 μm, or 20 μm.

Because of an existence of the boss 500, a raised terrain is formed at a position of a side of the driving function layer 200 facing away from the base 100 corresponding to the boss 500. That is, a part of the driving function layer 200 corresponding to the boss 500 protrudes in a direction facing away from the base 100 to form the first sub-barrier part 210. The orthographic projection of the first sub-barrier part 210 on the base 100 covers an orthographic projection of the boss 500 on the base 100. A thickness of the first sub-barrier part 210 is greater than or equal to the thickness of the boss 500.

The insulating layer 300 is disposed on the side of the driving function layer 200 facing away from the base 100, and the opening 301 exposing the conductive pad 303 is defined on the insulating layer 300. An orthographic projection of the opening 301 on the base 100 is within an area of the orthographic projection of the boss 500 on the base 100. The orthographic projection of the first sub-barrier part 210 on the base 100 covers the orthographic projection of the boss 500 on the base 100. Therefore, a part of the insulating layer 300 adjacent to the opening 301 is formed on the first sub-barrier part 210. Affected by a topography of the first sub-barrier part 210, a part of the insulating layer 300 corresponding to the first sub-barrier part 210 protrudes in a direction facing away from the base 100 to form the second sub-barrier part 310.

When manufacturing the reflective layer 400 on the insulating layer 300, the second sub-barrier part 310 may prevent the reflective layer 400 from overflowing to a side of the opening 301, thereby preventing the reflective layer 400 from overflowing onto the conductive pad 203 and leading to abnormal tin loading.

It should be noted that an area corresponding to the opening 301 is a bonding area of a LED chip and the conductive pad 203 subsequently, that is generally referred to as a pad area.

A material of the reflective layer 400 includes the white oil, certainly, the material of the reflective layer 400 may further be other reflective materials, such as black and white double-sided adhesive tape or other types of reflective ink, etc.

Furthermore, the second sub-barrier part 310 extends along a side surface of the first sub-barrier part 210 to a side of the first sub-barrier part 210 facing away from the base 100. In this way, a thickness h1 of the second sub-barrier part 310 may be increased to ensure that there is a larger height difference between a part of the insulating layer 300 adjacent to the second sub-barrier part 310 and the second sub-barrier part 310, thereby achieving a better effect of blocking the reflective layer 400.

Furthermore, the height difference h1' between the part of the insulating layer 300 adjacent to the second sub-barrier part 310 and the second sub-barrier part 310 is greater than a thickness h2 of the reflective layer 400, so as to ensure that the reflective layer 400 cannot overflow over the second sub-barrier part 310 onto the conductive pad 203.

It may be understood that the insulating layer 300 extends from a side of the first sub-barrier part 210 to the side of the first sub-barrier part 210 facing away from the base 100, and the thickness h1 of the second sub-barrier part 310 is at least equal to the thickness of the first sub-barrier part 210.

Figure 2:
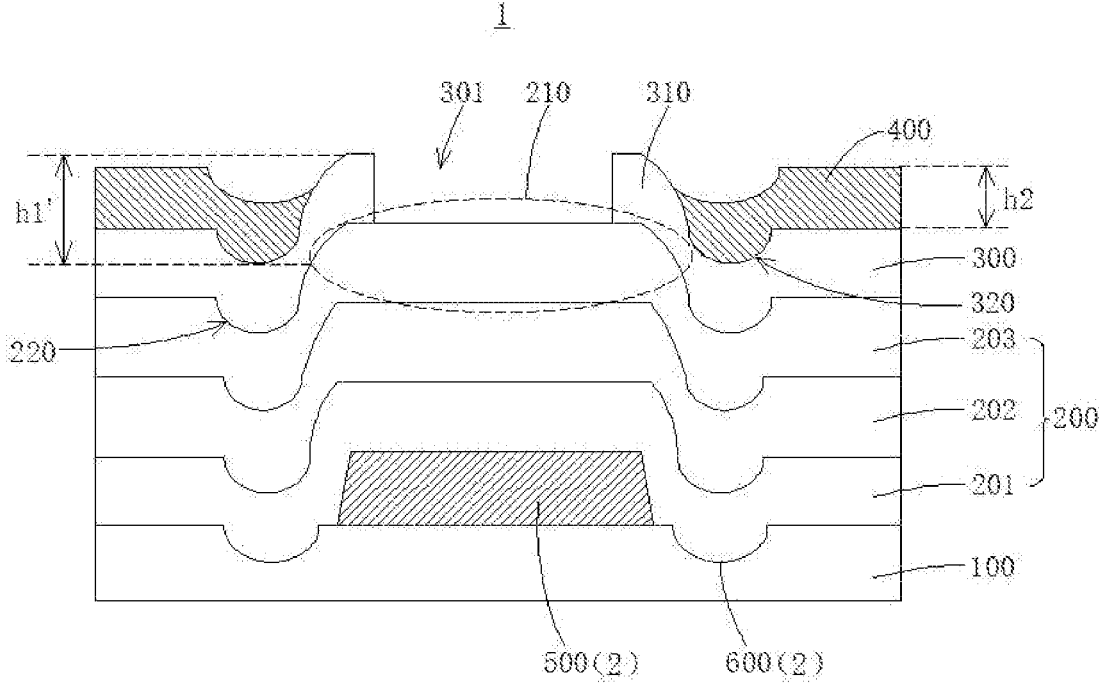
FIG. 2 is a schematic cross-sectional diagram of a second substrate in a second embodiment of the present application.

Referring to FIG. 2, a schematic cross-sectional diagram of a second substrate in a second embodiment of the present application is shown. The substrate 1 of this embodiment includes the base 100, the driving function layer 200, the insulating layer 300, and the reflective layer 400 stacked. The substrate 1 of this embodiment differs from the substrate of the first embodiment above-mentioned in that, in addition to the boss 500, the barrier part 2 of this embodiment further includes a groove 600 defined at an outer periphery of the boss 500. In addition to the first sub-barrier part 210, the driving function layer 200 further includes a third sub-barrier part 220 located at an outer periphery of the first sub-barrier part 210. The insulating layer 300 includes a fourth sub-barrier part 320 corresponding to the third sub-barrier part 220. The fourth sub-barrier part 320 is located at an outer periphery of the second sub-barrier part 310. An edge part of the reflective layer 400 is located on the fourth sub-barrier part 320.

Specifically, the third sub-barrier part 220 may be formed in following ways: referring to FIG. 2, the groove 600 is defined on the side surface of the base 100 facing the driving function layer 200. The driving function layer 200 fills the groove 600, so that a part of the driving function layer 200 corresponding to the groove 600 is recessed toward a side adjacent to the base 100 to form the third sub-barrier part 220.

A depth of the groove 600 ranges from 1 μm to 2 μm. For example, the depth of the groove 600 may be 1 μm, 1.5 μm, 1.8 μm, or 2 μm. A width of the groove 600 ranges from 3 μm to 10 μm. For example, the width of the groove 600 may be 3 μm, 5 μm, 8 μm, or 10 μm.

The insulating layer 300 is disposed on the side of the driving function layer 200 facing away from the base 100. Affected by a topography of the third sub-barrier part 220, a part of the insulating layer 300 corresponding to the third sub-barrier part 220 is recessed toward a side adjacent to the base 100 to form the fourth sub-barrier part 320.

Figure 3:
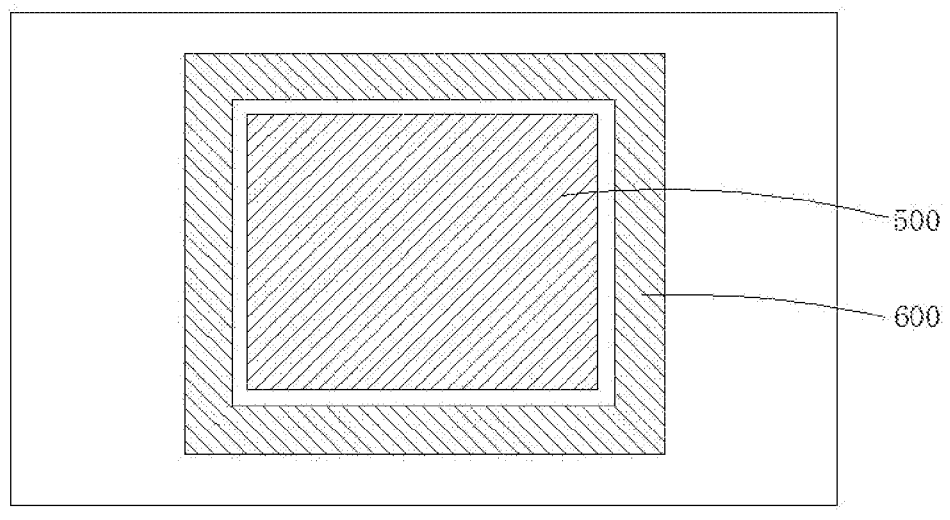
FIG. 3 is a schematic cross-sectional diagram of a boss and a groove of the substrate in the second embodiment of the present application.

Referring to FIG. 3, a schematic cross-sectional diagram of a boss and a groove in the second embodiment of the present application is shown. In a top view of the substrate 1, the groove 600 is defined at the outer periphery of the boss 500. The groove 600 may be defined adjacent to the boss 500 or may be spaced from the boss 500.

An orthographic projection of the fourth sub-barrier part 320 on the base 100 overlaps an orthographic projection of the third sub-barrier part 220 on the base 100.

Furthermore, the third sub-barrier part 220 abuts the first sub-barrier part 210, and the fourth sub-barrier part 320 abuts the second sub-barrier part 310.

In this embodiment, the first sub-barrier part 210 is combined with the third sub-barrier part 220, and the second sub-barrier part 310 is combined with the fourth sub-barrier part 320, which further increases the height difference h1' between the part of the insulating layer 300 adjacent to the second sub-barrier part 310 (that is, a part of the insulating layer 300 corresponding to the fourth sub-barrier part 320) and the second sub-barrier part 310. The height difference h1' is greater than the thickness h2 of the reflective layer 400. The reflective layer 400 overflows to the fourth sub-barrier part 320, so that a liquid level or a surface position at an edge of the reflective layer 400 is lowered, and a distance between the liquid level or the surface position at the edge of the reflective layer 400 is further increased, thereby ensuring that the reflective layer 400 cannot overflow over the second sub-barrier portion 310 onto the conductive pad 203.

It may be understood that other structures of the substrate in this embodiment are same as other structures of the substrate in the first embodiment and will not be described here.

Figure 4:
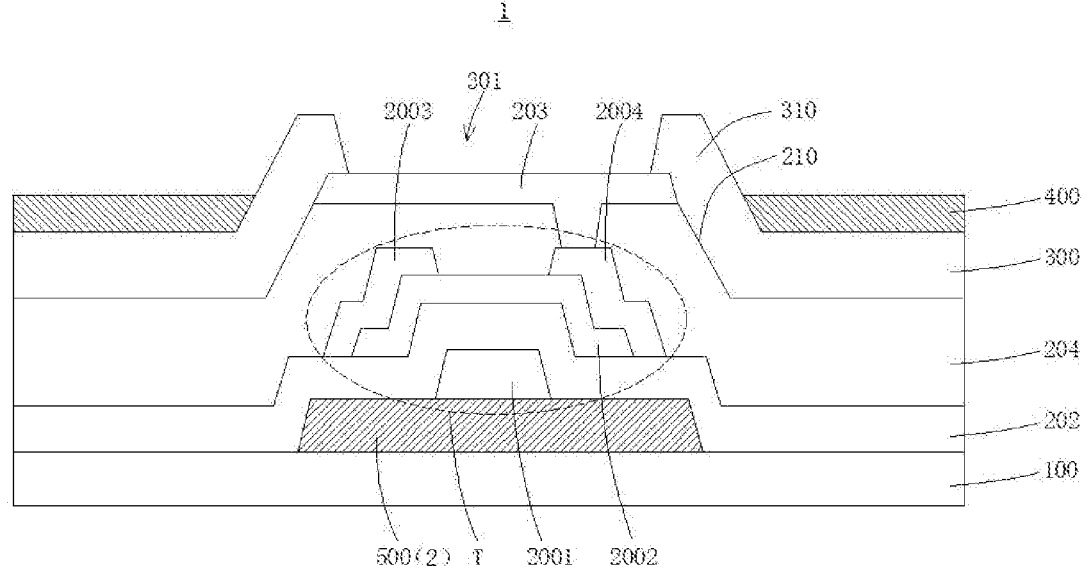
FIG. 4 is another schematic cross-sectional diagram of the substrate in the first embodiment of the present application.

Referring to FIG. 1, FIG. 2, and FIG. 4, FIG. 4 is another schematic cross-sectional diagram of the substrate in the first embodiment of the present application. In the substrate of the first embodiment and the substrate of the second embodiment, the driving function layer 200 may specifically include a dielectric layer 204, a thin film transistor T, and the conductive pad 203. The thin film transistor T includes a gate electrode 2001, a gate insulating layer 202, an active layer 2002, a source electrode 2003, and a drain electrode 2004. The gate electrode 2001 is located in the first metal layer 201. The gate insulating layer 202 is located on the first metal layer 201. The active layer 2002 is located on the gate insulating layer 202. The active layer 2002 includes a channel area and conductor areas located on both sides of the channel area. The source electrode 2003 and the drain electrode 2004 are located on the active layer 2002 and are respectively connected to one corresponding of the conductor areas of the active layer 2002. The dielectric layer 204 is located on the source electrode 2003 and the drain electrode 2004. The conductive pad 203 is located on the dielectric layer 204 and is electrically connected with the source electrode 2003 or the drain electrode 2004 through a via hole going through the dielectric layer 204.

It should be noted that, the thin film transistor with a bottom gate structure is taken as an example in this embodiment. Certainly, the thin film transistor T may further be a top gate structure in other embodiments.

FIG. 4 takes the substrate in the first embodiment as an example. The boss 500 is disposed on a side of the substrate 100 facing the driving function layer 200. An orthographic projection of the thin film transistor T on the base 100 overlaps the orthographic projection of the boss 500 on the base 100. The conductive pad 203 is located on a side of the thin film transistor T facing away from the base 100. That is to say, the thin film transistor T is formed on the boss 500. The boss 500 is superimposed on the thin film transistor T, which further improves the raised terrain formed at the position of the side of the driving function layer 200 facing away from the base 100 corresponding to the boss 500, that is, further increases the thickness of the first sub-barrier part 210.

The thickness of the first sub-barrier part 210 is greater than the thickness of the boss 500. The orthographic projection of the first sub-barrier part 210 on the base 100 covers the orthographic projection of the boss 500 on the base 100.

The insulating layer 300 is disposed on the side of the driving function layer 200 facing away from the base 100. The opening 301 exposing the conductive pad 203 is defined on the insulating layer 300. The orthographic projection of the opening 301 on the base 100 is within the area of the orthographic projection of the boss 500 on the base 100. Therefore, the part of the insulating layer 300 adjacent to the opening 301 is formed on the first sub-barrier part 210. Affected by the topography of the first sub-barrier part 210, the part of the insulating layer 300 corresponding to the first sub-barrier part 210 protrudes in the direction facing away from the base 100 to form the second sub-barrier part 310.

When manufacturing the reflective layer 400 on the insulating layer 300, the second sub-barrier part 310 may prevent the reflective layer 400 from overflowing to the side of the opening 301, thereby preventing the reflective layer 400 from overflowing onto the conductive pad 203 and leading to abnormal tin loading.

Figure 5:
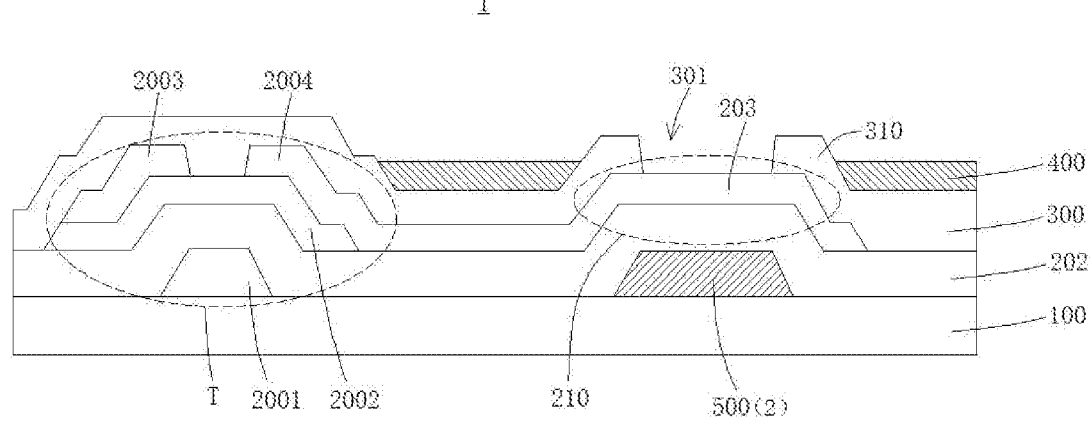
FIG. 5 is another schematic cross-sectional diagram of the substrate in the first embodiment of the present application.

Referring to FIG. 1, FIG. 2, and FIG. 5, FIG. 5 is another schematic cross-sectional diagram of the substrate in the first embodiment of the present application. In the substrate of the first embodiment and the substrate of the second embodiment mentioned above, the driving function layer 200 may specifically include the thin film transistor T and the conductive pad 203. The thin film transistor T includes the gate electrode 2001, the gate insulating layer 202, the active layer 2002, the source electrode 2003, and the drain electrode 2004. The gate electrode 2001 is located in the first metal layer 201. The gate insulating layer 202 is located on the first metal layer 201. The active layer 2002 is located on the gate insulating layer 202. The active layer 2002 includes the channel area and the conductor areas located on both sides of the channel area. The source electrode 2003 and the drain electrode 2004 are located on the active layer 2002 and are respectively connected to one corresponding of the conductor areas of the active layer 2002. The conductive pad 203, the source electrode 2003, and the drain electrode 2004 are disposed in a same layer, and the conductive pad 203 is electrically connected with the source electrode 2003 or the drain electrode 2004. Furthermore, the conductive pad 203 may be integrally formed with the source electrode 2003 or the drain electrode 2004

In this embodiment, the orthographic projection of the thin film transistor T on the base 100 and the orthographic projection of the boss 500 on the base 100 are spaced.

It should be noted that the thin film transistor with the bottom gate structure is taken as an example in this embodiment. Certainly, the thin film transistor T may further be the top gate structure in other embodiments.

FIG. 5 takes the substrate in the first embodiment as an example. The boss 500 is disposed on the side of the substrate 100 facing the driving function layer 200. Because of the existence of the boss 500, the raised terrain is formed at the position of the side of the driving function layer 200 facing away from the base 100 corresponding to the boss 500. That is, the part of the driving function layer 200 corresponding to the boss 500 protrudes in the direction facing away from the base 100 to form the first sub-barrier part 210. The thickness of the first sub-barrier part 210 is greater than or equal to the thickness of the boss 500. The orthographic projection of the first sub-barrier part 210 on the base 100 covers the orthographic projection of the boss 500 on the base 100.

The insulating layer 300 is disposed on the side of the driving function layer 200 facing away from the base 100, and the opening 301 exposing the conductive pad 303 is defined on the insulating layer 300. The orthographic projection of the opening 301 on the base 100 is within the area of the orthographic projection of the boss 500 on the base 100. Therefore, the part of the insulating layer 300 adjacent to the opening 301 is formed on the first sub-barrier part 210. Affected by the topography of the first sub-barrier part 210, the part of the insulating layer 300 corresponding to the first sub-barrier part 210 protrudes in the direction facing away from the base 100 to form the second sub-barrier part 310.

When manufacturing the reflective layer 400 on the insulating layer 300, the second sub-barrier part 310 may prevent the reflective layer 400 from overflowing to the side of the opening 301, thereby preventing the reflective layer 400 overflowing onto the conductive pad 203 and leading to abnormal tin loading.

A light-emitting substrate provided by the embodiment of the present application includes mentioned above substrate and a light-emitting diode (LED) chip. The LED chip is disposed on the substrate and electrically connected to the conductive pad.

In an embodiment, the light-emitting substrate may be a Mini-LED direct display panel, a Micro-LED direct display panel, or other LED direct display panels, which are not limited here.

In another embodiment, the light-emitting substrate may further be taken as a backlight of a liquid crystal display (LCD) panel.

In summary, the substrate and the light-emitting substrate are provided by the present application. The barrier part is disposed on the base to make the driving function layer above form the first sub-barrier part. The conductive pad is disposed on the first sub-barrier part. The insulating layer above the driving function layer correspondingly forms the second sub-barrier part at the position corresponding to the first sub-barrier part and exposes the conductive pad. The reflective layer may be blocked by the second sub-barrier part after the reflective layer is manufactured, so as to prevent the reflective layer from overflowing onto the conductive pad and leading to abnormal tin loading.

The embodiments of the present application are described in detail above. The principle and implementations of the present application are described in this specification by using specific examples. The descriptions about the foregoing embodiments are merely provided to help understand the method and core ideas of the present disclosure. In addition, persons of ordinary skill in the art can make modifications in terms of the specific implementations and application scopes according to the ideas of the present disclosure. Therefore, the content of this specification shall not be construed as a limit to the present application.

What is claimed is:

1. A substrate, comprising:
a base;
a driving function layer located at a side of the base, wherein the driving function layer comprises a conductive pad;
an insulating layer disposed on a side of the driving function layer away from the base, wherein an opening exposing the conductive pad is defined on the insulating layer; and
a reflective layer disposed on a side of the insulating layer away from the base;
wherein in a direction perpendicular to the substrate, a height of a part of the insulating layer located surrounding the opening is greater than a height of the reflective layer, the part of the insulating layer located surrounding the opening protrudes from a surface of the reflective layer on a side of the insulating layer away from the base, and
wherein a part of the driving function layer protrudes in a direction facing away from the base.

2. The substrate according to claim 1, further comprising a barrier part located on the base and disposed facing the driving function layer, wherein the barrier part corresponds to the opening, the driving function layer comprises a first sub-barrier part corresponding to the barrier part, the insulating layer comprises a second sub-barrier part corresponding to the first sub-barrier part, and the reflective layer is located on a side of the second sub-barrier part away from the opening.

3. The substrate according to claim 2, wherein the barrier part comprises a boss, an orthographic projection of the first sub-barrier part on the base covers an orthographic projection of the boss on the base, and an orthographic projection of the opening on the base is within an area of the orthographic projection of the boss on the base;
a part of the driving function layer corresponding to the boss is protruded in a direction facing away from the base to form the first sub-barrier part, a part of the insulating layer corresponding to the first sub-barrier part is protruded in the direction facing away from the base to form the second sub-barrier part, and an orthographic projection of the second sub-barrier part on the base partially overlaps the orthographic projection of the first sub-barrier part on the base.

4. The substrate according to claim 3, wherein a thickness of the boss ranges from 1 $\mu$m to 20 $\mu$m, and a thickness of the first sub-barrier part is greater than or equal to the thickness of the boss.

5. The substrate according to claim 3, wherein the barrier part further comprises a groove defined at an outer periphery of the boss, the driving function layer further comprises a third sub-barrier part located at an outer periphery of the first sub-barrier part, the insulating layer further comprises a fourth sub-barrier part corresponding to the third sub-barrier part, the fourth sub-barrier part is located at an outer periphery of the second sub-barrier part, and an edge part of the reflective layer adjacent to the opening is located on the fourth sub-barrier part;
a part of the driving function layer corresponding to the groove is recessed toward a side adjacent to the base to form the third sub-barrier part, a part of the insulating layer corresponding to the third sub-barrier part is recessed toward a side adjacent to the base to form the fourth sub-barrier part, and an orthographic projection of the fourth sub-barrier part on the base at least partially overlaps an orthographic projection of the third sub-barrier part on the base; and
the third sub-barrier part abuts the first sub-barrier part, and the fourth sub-barrier part abuts the second sub-barrier part.

6. The substrate according to claim 3, wherein the driving function layer further comprises a thin film transistor, and an orthographic projection of the thin film transistor on the base overlaps the orthographic projection of the boss on the base; the conductive pad is located on a side of the thin film transistor away from the base, and the conductive pad is electrically connected with the thin film transistor through a via hole.

7. The substrate according to claim 3, wherein the driving function layer further comprises a thin film transistor, the thin film transistor comprises a source electrode and a drain electrode, and an orthographic projection of the thin film transistor on the base and the orthographic projection of the boss on the base are spaced;
the conductive pad, the source electrode, and the drain electrode are disposed in a same layer, and the conductive pad is electrically connected with the source electrode or the drain electrode.

8. The substrate according to claim 5, wherein the driving function layer further comprises a thin film transistor, an orthographic projection of the thin film transistor on the base overlaps the orthographic projection of the boss on the base, the conductive pad is located on a side of the thin film transistor away from the base, and the conductive pad is electrically connected with the thin film transistor through a via hole.

9. The substrate according to claim 5, wherein the driving function layer further comprises a thin film transistor, the thin film transistor comprises a source electrode and a drain electrode, and an orthographic projection of the thin film transistor on the base and the orthographic projection of the boss on the base are spaced;

the conductive pad, the source electrode, and the drain electrode are disposed in a same layer, and the conductive pad is electrically connected with the source electrode or the drain electrode.

10. The substrate according to claim 1, wherein there is a height difference between a part of the insulating layer adjacent to the second sub-barrier part and the second sub-barrier part, and the height difference is greater than or equal to a thickness of the reflective layer.

11. The substrate according to claim 2, wherein the second sub-barrier part extends along a side surface of the first sub-barrier part to a side of the first sub-barrier part facing away from the base.

12. The substrate according to claim 11, wherein a thickness of the second sub-barrier part is at least equal to a thickness of the first sub-barrier part.

13. The substrate according to claim 1, wherein a material of the reflective layer comprises white oil.

14. A light-emitting substrate, comprising a substrate and a light-emitting diode (LED) chip disposed on the substrate; wherein the substrate comprises:

a base;

a driving function layer located at a side of the base, the driving function layer comprises a conductive pad;

an insulating layer disposed on a side of the driving function layer away from the base, an opening exposing the conductive pad is defined on the insulating layer; and a reflective layer disposed on a side of the insulating layer away from the base;

in a direction perpendicular to the substrate, a height of a part of the insulating layer located surrounding the opening is greater than a height of the reflective layer, the part of the insulating layer located surrounding the opening protrudes from a surface of the reflective layer on a side of the insulating layer away from the base, and wherein a part of the driving function layer protrudes in a direction facing away from the base.

15. The light-emitting substrate according to claim 14, wherein the substrate further comprises a barrier part located on the base and disposed facing the driving function layer, the barrier part corresponds to the opening, the driving function layer comprises a first sub-barrier part corresponding to the barrier part, the insulating layer comprises a second sub-barrier part corresponding to the first sub-barrier part, and the reflective layer is located on a side of the second sub-barrier part away from the opening.

16. The light-emitting substrate according to claim 15, wherein the barrier part comprises a boss, an orthographic projection of the first sub-barrier part on the base covers an orthographic projection of the boss on the base, and an orthographic projection of the opening on the base is within an area of the orthographic projection of the boss on the base;

a part of the driving function layer corresponding to the boss is protruded in a direction facing away from the base to form the first sub-barrier part, a part of the insulating layer corresponding to the first sub-barrier part is protruded in the direction facing away from the base to form the second sub-barrier part, and an orthographic projection of the second sub-barrier part on the base partially overlaps the orthographic projection of the first sub-barrier part on the base.

17. The light-emitting substrate according to claim 16, wherein the barrier part further comprises a groove defined at an outer periphery of the boss, the driving function layer further comprises a third sub-barrier part located at an outer periphery of the first sub-barrier part, the insulating layer further comprises a fourth sub-barrier part corresponding to the third sub-barrier part, the fourth sub-barrier part is located at an outer periphery of the second sub-barrier part, and an edge part of the reflective layer adjacent to the opening is located on the fourth sub-barrier part;

a part of the driving function layer corresponding to the groove is recessed toward a side adjacent to the base to form the third sub-barrier part, a part of the insulating layer corresponding to the third sub-barrier part is recessed toward a side adjacent to the base to form the fourth sub-barrier part, and an orthographic projection of the fourth sub-barrier part on the base at least partially overlaps an orthographic projection of the third sub-barrier part on the base; and the third sub-barrier part abuts the first sub-barrier part, and the fourth sub-barrier part abuts the second sub-barrier part.

18. The light-emitting substrate according to claim 16, wherein the driving function layer further comprises a thin film transistor, and an orthographic projection of the thin film transistor on the base overlaps the orthographic projection of the boss on the base; the conductive pad is located on a side of the thin film transistor away from the base, and the conductive pad is electrically connected with the thin film transistor through a via hole.

19. The light-emitting substrate according to claim 16, wherein the driving function layer further comprises a thin film transistor, the thin film transistor comprises a source electrode and a drain electrode, and an orthographic projection of the thin film transistor on the base and the orthographic projection of the boss on the base are spaced;

the conductive pad, the source electrode, and the drain electrode are disposed in a same layer, and the conductive pad is electrically connected with the source electrode or the drain electrode.

20. The light-emitting substrate according to claim 14, wherein there is a height difference between a part of the insulating layer adjacent to the second sub-barrier part and the second sub-barrier part, and the height difference is greater than or equal to a thickness of the reflective layer.

* * * * *